(12) United States Patent
Choi

(10) Patent No.: US 8,648,648 B2
(45) Date of Patent: Feb. 11, 2014

(54) BANDGAP VOLTAGE REFERENCE CIRCUIT, SYSTEM, AND METHOD FOR REDUCED OUTPUT CURVATURE

(75) Inventor: Davy Choi, Carrollton, TX (US)

(73) Assignee: STMicroelectronics, Inc., Coppell, TX (US)

( * ) Notice: Subject to any disclaimer, the term of this patent is extended or adjusted under 35 U.S.C. 154(b) by 44 days.

(21) Appl. No.: 13/013,431

(22) Filed: Jan. 25, 2011

(65) Prior Publication Data

US 2012/0169413 A1 Jul. 5, 2012

Related U.S. Application Data

(60) Provisional application No. 61/428,474, filed on Dec. 30, 2010.

(51) Int. Cl.
*G05F 1/10* (2006.01)
(52) U.S. Cl.
USPC .......................................... 327/539; 323/313
(58) Field of Classification Search
USPC .................................................. 327/513, 539
See application file for complete search history.

(56) References Cited

U.S. PATENT DOCUMENTS

| 5,325,045 | A * | 6/1994 | Sundby ......................... 323/313 |
|---|---|---|---|
| 6,218,822 | B1 * | 4/2001 | MacQuigg ..................... 323/313 |
| 6,462,527 | B1 * | 10/2002 | Maneatis ....................... 323/315 |
| 6,501,256 | B1 * | 12/2002 | Jaussi et al. ................... 323/315 |
| 6,590,372 | B1 * | 7/2003 | Wiles, Jr. ....................... 323/316 |
| 6,608,472 | B1 * | 8/2003 | Kutz et al. ..................... 323/313 |
| 6,724,176 | B1 * | 4/2004 | Wong et al. ................... 323/316 |
| 7,388,531 | B1 * | 6/2008 | Cyrusian ........................ 341/144 |
| 7,443,226 | B1 * | 10/2008 | Holloway et al. ............. 327/513 |
| 7,482,798 | B2 * | 1/2009 | Han ................................ 323/316 |
| 7,504,874 | B2 * | 3/2009 | Oehm ............................ 327/513 |
| 7,737,675 | B2 * | 6/2010 | Murase .......................... 323/314 |
| 7,777,558 | B2 * | 8/2010 | Chen .............................. 327/539 |
| 7,834,610 | B2 * | 11/2010 | Peng et al. ..................... 323/313 |
| 7,944,280 | B2 * | 5/2011 | Gabillard et al. ............. 327/538 |
| 7,960,961 | B2 * | 6/2011 | Cave .............................. 323/313 |
| 8,022,751 | B2 * | 9/2011 | Le et al. ......................... 327/539 |
| 8,044,677 | B2 * | 10/2011 | Cremonesi et al. ...... 324/762.01 |
| 8,102,201 | B2 * | 1/2012 | Marinca ......................... 327/539 |
| 8,106,707 | B2 * | 1/2012 | Katyal et al. .................. 327/539 |
| 2006/0043957 | A1 * | 3/2006 | Carvalho ....................... 323/313 |
| 2007/0001748 | A1 * | 1/2007 | Washburn ..................... 327/539 |

(Continued)

OTHER PUBLICATIONS

Malcovati et al. (Jul. 2001) "Curvature-Compensated BICMOS Bandgap With 1-V Supply Voltage"; IEEE J. Solid-State Circuits; 36:1076-1081.

(Continued)

*Primary Examiner* — Thomas J Hiltunen
(74) *Attorney, Agent, or Firm* — Graybeal Jackson LLP

(57) ABSTRACT

A bandgap voltage reference circuit includes a current generation stage configured to generate a proportional to absolute temperature (PTAT) current and a complementary to absolute temperature (CTAT) current and to generate a reference current by combining the PTAT and CTAT currents. An output stage is coupled to the current generation stage and configured to combine the PTAT current and the CTAT current to generate a bandgap voltage reference. A curvature correction circuit is configured to generate a curvature correction current that mirrors the reference current generated from the PTAT and CTAT currents. The curvature correction current has a ratio relative to the reference current given by a current ratio parameter having value that is less than one, equal to one, or greater than one. In this way the value of the current ratio parameter can be varied to cancel a non-linear dependence on temperature of the bandgap voltage reference, thereby providing a curvature-compensated bandgap voltage reference.

23 Claims, 7 Drawing Sheets

(56) References Cited

U.S. PATENT DOCUMENTS

2009/0085651 A1* 4/2009 Liu et al. .................. 327/539
2011/0255568 A1* 10/2011 Swei ............................ 374/180

OTHER PUBLICATIONS

Pertijs et al. (Dec. 2005) "A CMOS Smart Temperature Sensor With a 3σ Inaccuracy of ± 0.1° C. From -55° C. to 125° C."; IEEE J. Solid-State Circuits; 40:2805-2815.

Dai et al. (2006) "Explicit Characterization of Bandgap References"; IEEE International Symposium on Circuits and Systems (ISCAS); pp. 573-576.

Tsividis (Dec. 1980) "Accurate Analysis of Temperature Effects in IC-VBE Characteristics with Application to Bandgap Reference Sources"; IEEE Journal of Solid-State Circuits; SC-15(6):1076.

Ker et al. (2005) "New Curvature-Compensation Technique for CMOS Bandgap Reference With Sub-1-V Operation"; Final Manuscript of TCAS-II 1936; IEEE; 5 Pages.

* cited by examiner

BANDGAP VOLTAGE REFERENCE CIRCUIT, SYSTEM, AND METHOD FOR REDUCED OUTPUT CURVATURE

PRIORITY CLAIM

The present application claims the benefit of U.S. Provisional Patent Application No. 61/428,474, filed Dec. 30, 2010, which application is incorporated herein by reference in its entirety.

TECHNICAL FIELD

Embodiments of the present invention relate generally to the generation of a voltage reference and, more specifically, to curvature correction in bandgap voltage reference circuits.

BACKGROUND

The generation of accurate voltage references is required in myriad electronic systems, such as in power supplies, data conversion circuits such as analog-to-digital converters and digital-to-analog converters, and in measurement and control systems. Voltage reference generation circuits must provide the required reference voltages having values that are, ideally, independent of power supply fluctuations and temperature changes. This is true if the electronic circuitry containing the voltage reference generation circuits is to operate properly when such power supply and temperature changes occur.

A bandgap voltage reference circuit is a popular circuit for use in generating accurate voltage references in integrated circuits. Microprocessors, memory devices, and a wide variety of other types of integrated circuits commonly found in modern electronic systems utilize bandgap voltage reference circuits. As will be appreciated by those skilled in the art, a bandgap voltage reference circuit utilizes the weighted sum of a proportional to absolute temperature (PTAT) voltage (i.e., a voltage with a positive temperature coefficient) and a complementary to absolute temperature (CTAT) voltage (i.e., a voltage with a negative temperature coefficient). A PN junction has such a CTAT voltage characteristic and thus the CTAT voltage is typically provided through the base-emitter voltage Vbe of a bipolar transistor. The PTAT voltage is typically provided through the difference in base-emitter voltages Vbe1, Vbe2 of two bipolar junction transistors Q1, Q2 operating at different current densities, namely $\Delta Vbe=Vbe2-Vbe1$. If the collector current densities of the two transistors Q1, Q2 are properly selected (i.e., collector current density of transistor Q2 greater than collector current density of transistor Q1) then the voltage $\Delta Vbe$ has a positive temperature coefficient, as will be understood by those skilled in the art.

Proper operation of a bandgap voltage reference circuit assumes that the base-emitter voltage Vbe is a linear function of temperature. While this is true to a first order approximation, the voltage across a PN junction and thus in the base-emitter voltage Vbe has nonlinearities as a function as temperature, with the magnitude of these nonlinearities typically being termed "curvature." In many applications the effect of the curvature over the required temperature range on the generated voltage reference is unacceptable and must be compensated for. "Curvature correction" is the elimination of or compensation for curvature in order to thereby eliminate or reduce the effects of curvature on the output voltage reference provided by the bandgap voltage reference circuit. Improved curvature correction methods, circuits, and systems are needed.

SUMMARY

Embodiments of the present invention are directed to circuits, systems, and methods of generating a bandgap voltage reference. In one embodiment, a bandgap voltage reference circuit includes a current generation stage configured to generate a proportional to absolute temperature (PTAT) current and a complementary to absolute temperature (CTAT) current and to generate a reference current by combining the PTAT and CTAT currents. An output stage is coupled to the current generation stage and configured to combine the PTAT current and the CTAT current to generate a bandgap voltage reference. A curvature correction circuit is configured to generate a curvature correction current that mirrors the reference current generated from the PTAT and CTAT currents. The curvature correction current has a ratio relative to the reference current given by a current ratio parameter having value that is less than one, equal to one, or greater than one. In this way the value of the current ratio parameter can be varied to cancel a non-linear dependence on temperature of the bandgap voltage reference, thereby providing a curvature-compensated bandgap voltage reference.

DETAILED DESCRIPTION

Figure 1:
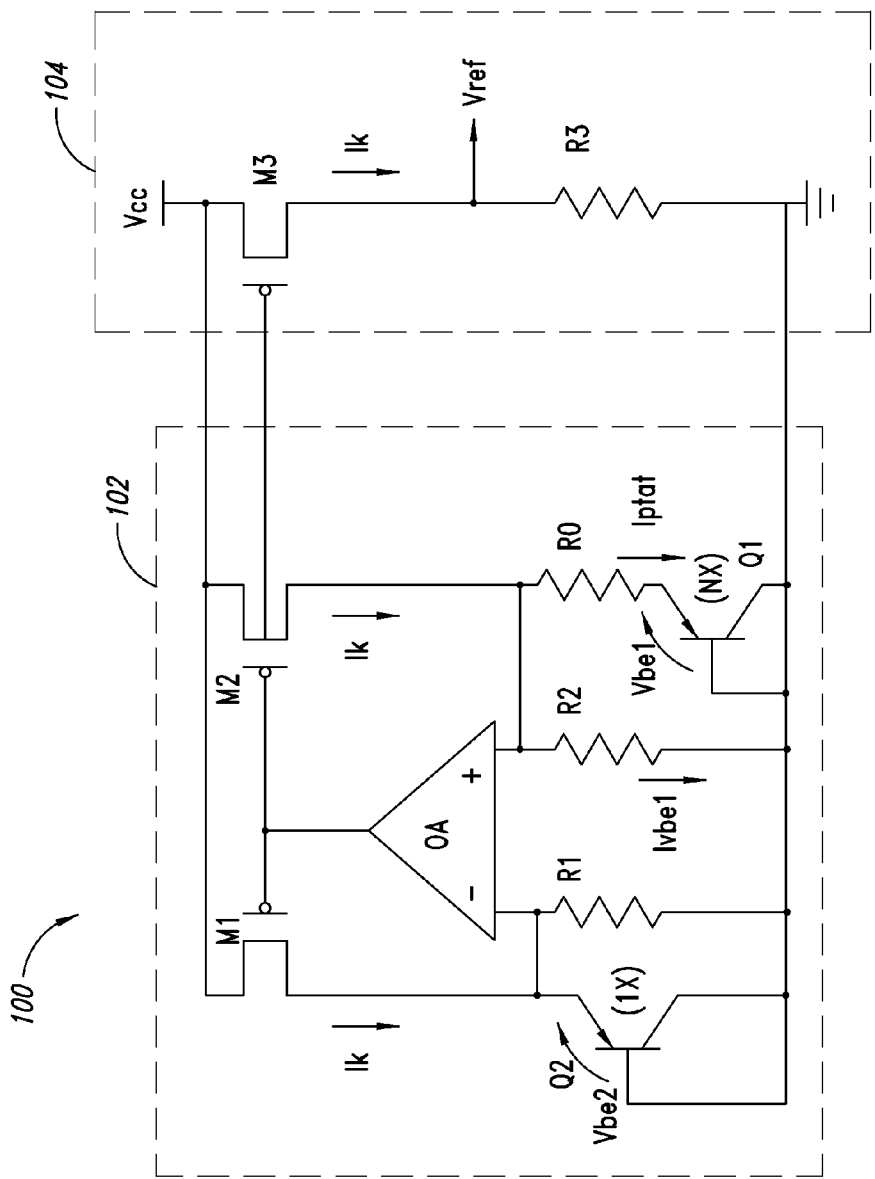
FIG. 1 is a schematic of a conventional bandgap voltage reference circuit.

FIG. 1 is a schematic of a conventional bandgap voltage reference circuit 100. The theory behind the operation of the circuit 100 including several mathematical equations describing the circuit will now be briefly described to serve as a foundation for the subsequent description of improved curvature correction techniques described below in detail with reference to embodiments of the present invention. In the present description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components or steps of any of the respective described embodiments may also be within the scope of the present invention although not expressly described in detail below. Finally, the operation of well-known components and/or processes has not been shown or described in detail below to avoid unnecessarily obscuring the present invention.

Turning now to the theory of operation of the bandgap voltage reference circuit 100 of FIG. 1, as understood by those skilled in art the base-emitter voltage of a bipolar junction transistor is given by the following equation:

$$V_{be} = \underbrace{V_{go}\left(1 - \frac{T}{T_0}\right) + \left(\frac{T}{T_0}\right)V_{be}(T_0)}_{\text{linear term}} - \underbrace{\eta\left(\frac{kT}{q}\right)\ln\left(\frac{T}{T_0}\right) + \frac{kT}{q}\ln\left(\frac{I_c(T)}{I_c(T_0)}\right)}_{\text{non-linear term}} \quad (1)$$

where $V_{go}$ is the bandgap voltage at 0° K, T is the temperature in degrees Kelvin (K), $T_0$ is the temperature in degrees K at given reference temperature, $Vbe(T_0)$ is the base-emitter voltage at the temperature $T_0$, $\eta$ is a temperature independent but process-dependent constant, k is Boltzmann's constant, q is the charge of an electron, $I_c(T)$ is the collector current at temperature T, and $I_c(T_0)$ is the collector current at the reference temperature $T_0$. As seen in Equation 1 above, the base-emitter voltage Vbe includes a linear term that is a linear function of the temperature T and a non-linear term that is a non-linear function of the temperature. It is this non-linear term of the base-emitter voltage Vbe that leads to the curvature previously discussed. Moreover, it is this non-linear term which, through curvature correction, is ideally compensated for or eliminated to thereby eliminate the effect of the curvature on the output voltage of the bandgap voltage reference circuit. Recall, the base-emitter voltage Vbe of a bipolar junction transistor is used as the complementary to absolute temperature CTAT voltage in a bandgap reference voltage circuit.

For the proportional to absolute temperature PTAT voltage in a bandgap voltage reference circuit, the difference in base-emitter voltages Vbe1, Vbe2 of two bipolar junction transistors Q1, Q2 operating at different current densities is utilized and is given by the following equation:

$$\Delta Vbe = (Vbe2 - Vbe1) = \frac{kT}{q}\ln(N) \quad (2)$$

where N is the ratio of the emitter areas of the two bipolar junction transistors Q1, Q2. As long as N>1 then ΔVbe has a positive temperature coefficient (i.e., is a PTAT voltage).

Turning now to the schematic of the conventional bandgap voltage reference circuit 100 of FIG. 1, the circuit operates to provide a voltage reference Vref having a value that is equal to the value of a current lk times the value of a resistor R3. The current lk has a PTAT component and a CTAT component and in this way the circuit 100 generates, to a first order approximation, the voltage reference Vref having a value that is substantially independent of temperature, as will now be explained in more detail. The bandgap voltage reference circuit 100 includes a current generation stage 102 including a bipolar junction transistor Q2 that functions to provide the CTAT voltage in the form of a base-emitter voltage Vbe2 of this transistor. A second bipolar junction transistor Q1 in the current generation stage 102 has a base-emitter voltage Vbe1 that enables the circuit 100 to generate the PTAT voltage in the form of the difference between the base-emitter voltages Vbe2-Vbe1 of the transistors Q2 and Q1 that is developed across a resistor R0.

The current generation stage 102 further includes an operational amplifier OA that receives the voltage developed across a resistor R1 on an inverting input and the voltage developed across a resistor R2 on a non-inverting input of the operational amplifier. A node defined at the interconnection of the resistor R0 and PMOS transistor M2 is coupled to the non-inverting input of the operational amplifier OA. The voltage across the resistor R1 corresponds to the base-emitter voltage Vbe2 of the transistor Q2 and the same is true for the voltage across the resistor R2 at the non-inverting input due to the operation of the operational amplifier OA, as will be appreciated by those skilled in the art. The resistors R1 and R2 have the same value.

The bandgap voltage reference circuit 100 further includes a first PMOS transistor M1 connected in series with the diode-connected bipolar junction transistor Q2 between a supply voltage VCC and ground. The output of the operational amplifier OA is applied to the gate of the PMOS transistor M1 so that a reference current lk is supplied by the PMOS transistor as shown in FIG. 1. A second PMOS transistor M2 is connected in series with the resistor R0 and diode-connected bipolar junction transistor Q1 between the supply voltage VCC and ground so that the PMOS transistor M2 similarly supplies the reference current lk. An output stage 104 of the bandgap voltage reference circuit 100 includes a third PMOS transistor M3 connected in series with a resistor R3 between the supply voltage VCC and ground so that the PMOS transistor M3 also supplies the reference current lk through the resistor R3 to thereby generate the voltage reference Vref supplied by the bandgap voltage reference circuit across the resistor.

In operation, the bandgap voltage reference circuit 100 generates the reference current lk having CTAT and PTAT components that result in the reference current and thus the voltage reference Vref being, to a first order approximation, substantially independent of temperature, as will now be described in more detail. As seen in FIG. 1, a current Ivbe1 flows through the second resistor R2 since the base-emitter voltage Vbe2 of the transistor Q2 is across the resistor R1 and the resistor R2 due to the operation of the operational amplifier OA. The current Ivbe1 is the CTAT component of the reference current lk since it is proportional to the base-emitter voltage Vbe2. A current Iptat flows through the resistor R0 where this current corresponds to the PTAT component of the reference current lk since the voltage across resistor R0 and thus the current Iptat through resistor R0 is determined by ΔVbe=Vbe2−Vbe1.

The reference current lk=Ivbe1+Iptat as seen FIG. 1. Referring back to equation 2 set forth above, it follows that $$Ik = Iptat + Ivbe1 = \frac{\Delta Vbe}{R0} + \frac{Vbe2}{R1} = = \frac{\frac{kT}{q}\ln(N)}{R0} + \frac{Vbe2}{R1} \quad (3)$$

and therefore since the reference current lk flows through the resistor R3 it follows that $$Vref = Ik \times R3 = \frac{R3}{R1}\left(\frac{R1}{R0} \times \frac{kT}{q}\ln(N) + Vbe2\right). \quad (4)$$

Equation 4 thus shows that through proper selection of the values for the resistors R1 and R0 and the value of N (the ratio of emitter areas of transistors Q1, Q2) the voltage reference Vref can be made, to a first order approximation, independent of temperature. The parameters k, T, and q define a value known as the thermal voltage $$VT = \frac{kT}{q}$$

having a temperature coefficient of approximately +0.086 mV/° C. while the base-emitter voltage Vbe2 has a temperature coefficient of approximately −2 mV/° C. As a result, to make the voltage reference Vref independent of temperature, to a first order approximation, the value of $$\left(\frac{R1}{R0}\ln(N)\right)$$

is selected as approximately 22 to thereby scale the temperature coefficient of the thermal voltage VT to substantially cancel the opposite signed temperature coefficient of the base-emitter voltage Vbe1. In other words, $$\left(\frac{R1}{R0}\ln(N)\right) \times .086 \text{ mV}/° \text{ C.} = 2 \text{ mV}/° \text{ C. if } \left(\frac{R1}{R0}\ln(N)\right)$$

has a value of approximately 22.

Figure 2:
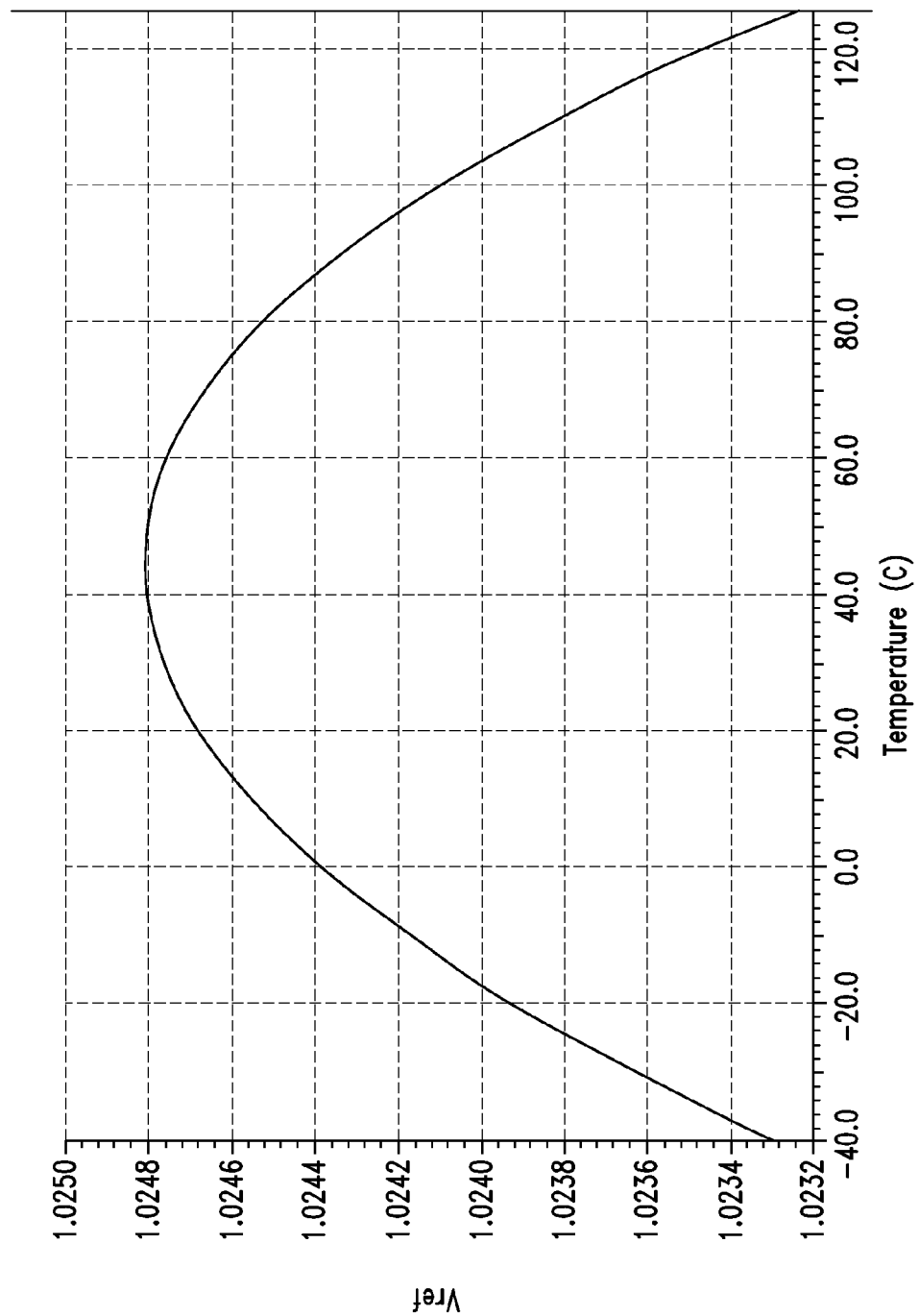
FIG. 2 is a graph showing the curvature of the voltage reference generated by the conventional bandgap voltage reference circuit of FIG. 1.

FIG. 2 is a graph showing the curvature of the voltage reference Vref generated by the conventional bandgap voltage reference circuit 100 of FIG. 1. The curvature of the voltage reference Vref is understood with reference to equations (1) and (4) above. As seen in equation (1) the base-emitter voltage Vbe of a bipolar junction transistor is actually a non-linear function of temperature T. As a result, the base-emitter voltage Vbe2 in equation (4) actually includes the non-linear term of equation (1) and this non-linear term results in the voltage reference Vref varying slightly as a function of temperature T as shown in the graph of FIG. 2. In the graph of FIG. 2, temperature T is shown along the horizontal axis and the magnitude of the voltage reference Vref along the vertical axis. The graph shows that over the illustrated temperature range of −40° C. to 125° C. the voltage reference Vref varies by approximately 1.53 mV, which corresponds to the curvature of the voltage reference. This curvature results from the non-linearity of the base-emitter voltage Vbe2 in equation (4) and, while the 1.53 mV magnitude may seem small, such a variation in the voltage reference Vref is unacceptable in many applications.

Figure 3:
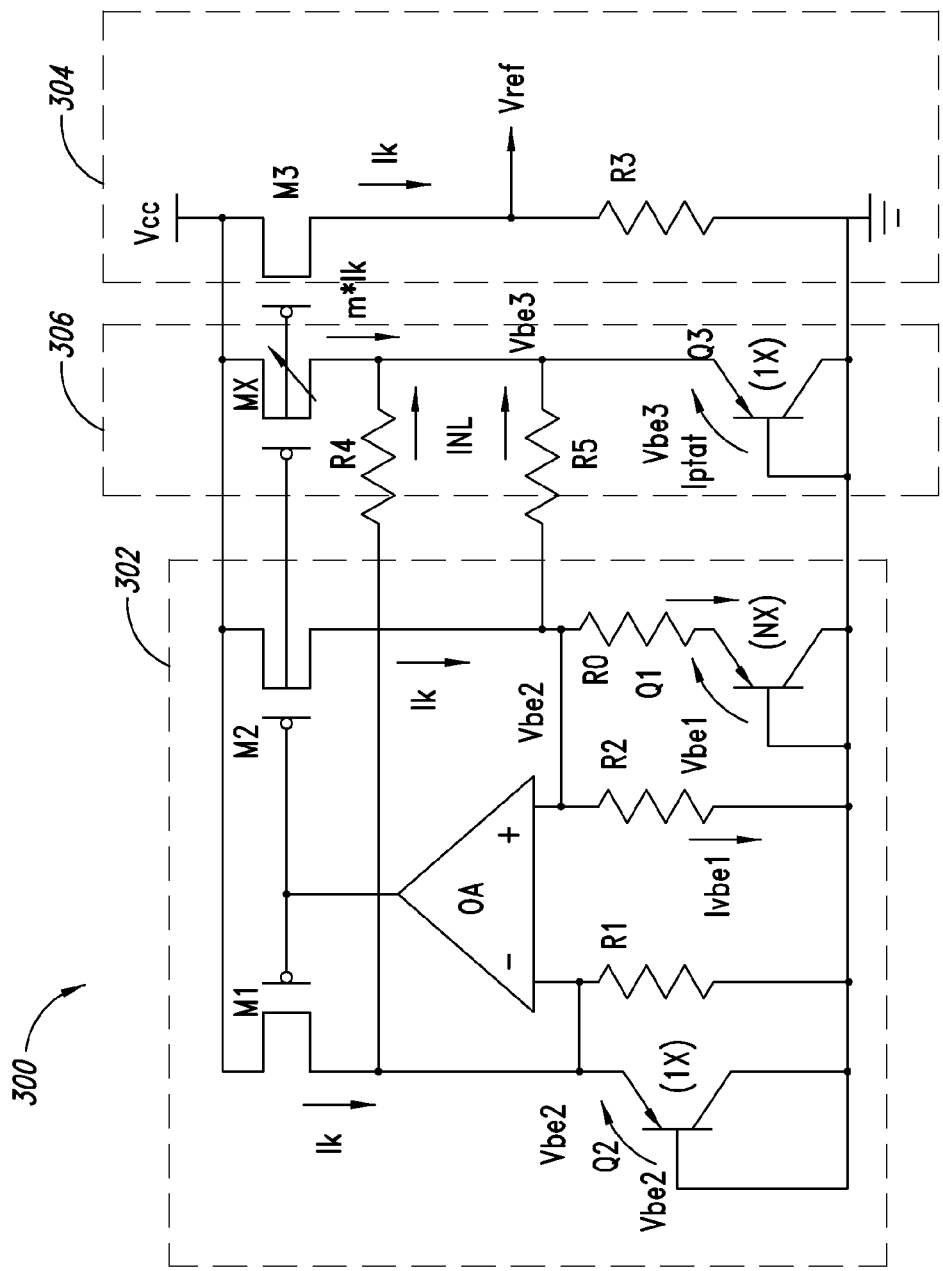
FIG. 3 is a schematic of a bandgap voltage reference circuit including curvature correction circuitry according to one embodiment of the present invention.

FIG. 3 is a schematic of a bandgap voltage reference circuit 300 including a current generation stage 302 and output stage 304 as in the circuit of bandgap voltage reference circuit 100 of FIG. 1 and further including curvature correction circuitry 306 according to one embodiment of the present invention. In the bandgap voltage reference circuit 300 of FIG. 3 components that are the same as those previously discussed with reference to the conventional bandgap voltage reference circuit 100 of FIG. 1 have been given the same reference descriptors and will not again be described in detail with reference to FIG. 3. The curvature correction circuitry 306 includes an additional PMOS transistor MX that mirrors the current Ik by a ratio "m" and thus supplies a mirrored current (m*Ik) to an additional bipolar junction transistor Q3 connected in series with PMOS transistor between the supply voltage VCC and ground. The ratio m will hereinafter be referred to as the "current ratio parameter" it will be described in more detail below. In addition, the curvature correction circuitry 306 includes a resistor R4 connected between the emitter of bipolar junction transistor Q2 and the emitter of bipolar junction transistor Q3 to draw a non-linear current INL having a value that is proportional to the difference between the base-emitter voltages Vbe2 and Vb3 of the bipolar junction transistors Q2 and Q3, respectively. A resistor R5 having the same value as the resistor R4 is similarly connected between the emitters of bipolar junction transistors Q1 and Q3 to likewise draw the non-linear current INL.

Before describing the embodiment of the bandgap voltage reference circuit 300 and curvature correction circuitry 306 of FIG. 3, the theory of operation of the curvature correction circuitry will first be discussed. With the curvature correction circuitry 306 the object is to generate a non-linear voltage that is proportional to the non-linear term in equation (1) and then use this voltage to compensate for the non-linear term and in this way reduce the curvature of the bandgap voltage reference circuit 300. Such a non-linear voltage, which is designated VNL and corresponds to the voltage developed across resistors R4 and R5 responsive to the non-linear current INL, can be developed by the proper combination of the base-emitter voltage Vbe across a PN junction with a temperature-independent current and the base-emitter voltage across a PN junction with a PTAT current, as will now be explained in more detail.

Referring back to equation (1) above, if the current through the base-emitter junction of a bipolar junction transistor is a PTAT current then the term $$\frac{I_c(T)}{I_c(T_0)}$$

in equation (1) becomes $$\frac{I_c(T)}{I_c(T_0)} = \frac{T}{T_0}$$

such that equation (1) is then:

$$V_{be} = V_{go}\left(1 - \frac{T}{T_0}\right) + \left(\frac{T}{T_0}\right)V_{be}(T_0) - (\eta - 1)\left(\frac{kT}{q}\right)\ln\left(\frac{T}{T_0}\right). \quad (5)$$

Now also note that if the current through the base-emitter junction of a bipolar junction transistor is a temperature independent current then in equation (1) the term $$\frac{I_c(T)}{I_c(T_0)} = 1$$

and so equation (1) becomes $$V_{be} = V_{go}\left(1 - \frac{T}{T_0}\right) + \left(\frac{T}{T_0}\right)V_{be}(T_0) - \eta\left(\frac{kT}{q}\right)\ln\left(\frac{T}{T_0}\right). \quad (6)$$

If the Vbe of equation 5 is subtracted from the Vbe of equation (6) then a term that corresponds to the non-linear voltage VNL mentioned above is obtained, as seen in the following equation:

$$VNL = \left(\frac{kT}{q}\right)\ln\left(\frac{T}{T_0}\right). \tag{7}$$

From equation (7) it is seen that the non-linear voltage VNL is a voltage proportional to the non-linear term of equation (5). The non-linear voltage VNL can be used to cancel or compensate for this non-linear term of a base-emitter junction of a bipolar transistor having a PTAT current, as will now be discussed in more detail.

In the bandgap voltage reference circuit 300 of FIG. 3, the current through the transistors Q1 and Q2 are PTAT currents and thus the base-emitter voltage Vbe1 and Vbe2 of these transistors are given by equation (5). With regard to transistor Q1 this is plainly seen as the current through resistor R0 is designated as proportional to absolute temperature current Iptat and this is the current that flows through transistor Q1. There is an obvious symmetry of currents summing at both the inverting and non-inverting inputs of the operational amplifier OA. As a result, transistors Q1 and Q2 have to carry identical currents. Thus, with regard to transistor Q2 the current through this transistor is similarly a PTAT current.

So the above shows that the base-emitter voltages Vbe1 and Vbe2 of transistors Q1 and Q2, respectively, can be used as the base-emitter voltage corresponding to equation (5). Also as mentioned above the current Ik supplied by PMOS transistor M1, and M2 for that matter, is to a first order approximation temperature independent. As a result, if this current is mirrored through a diode-connected bipolar junction transistor then the base-emitter voltage Vbe of this transistor will be given by equation (6). Referring to FIG. 3, the PMOS transistor MX is added to mirror the current Ik at a desired ratio "m" and supply this current through the bipolar junction transistor Q3 such that the base-emitter voltage Vbe3 is given by equation (6). Thus, by connecting resistor R4 across the emitters of the transistors Q2 and Q3 the non-linear voltage VNL of equation (7) will be developed across the resistor. In this way, the current INL through resistor R4 will be drawn from Ik being supplied by PMOS transistor M1 and thereby provide compensation for the non-linearity of the base-emitter voltage Vbe2 of transistor Q2. Similarly, by connecting resistor R5 across the emitters of the transistors Q1 and Q3 the non-linear voltage VNL of equation (7) will be developed across the resistor such that the current INL through resistor R5 will be drawn from Ik being supplied by PMOS transistor M2 to provide compensation for the non-linearity of the base-emitter voltage Vbe1 of transistor Q1.

Figure 4:
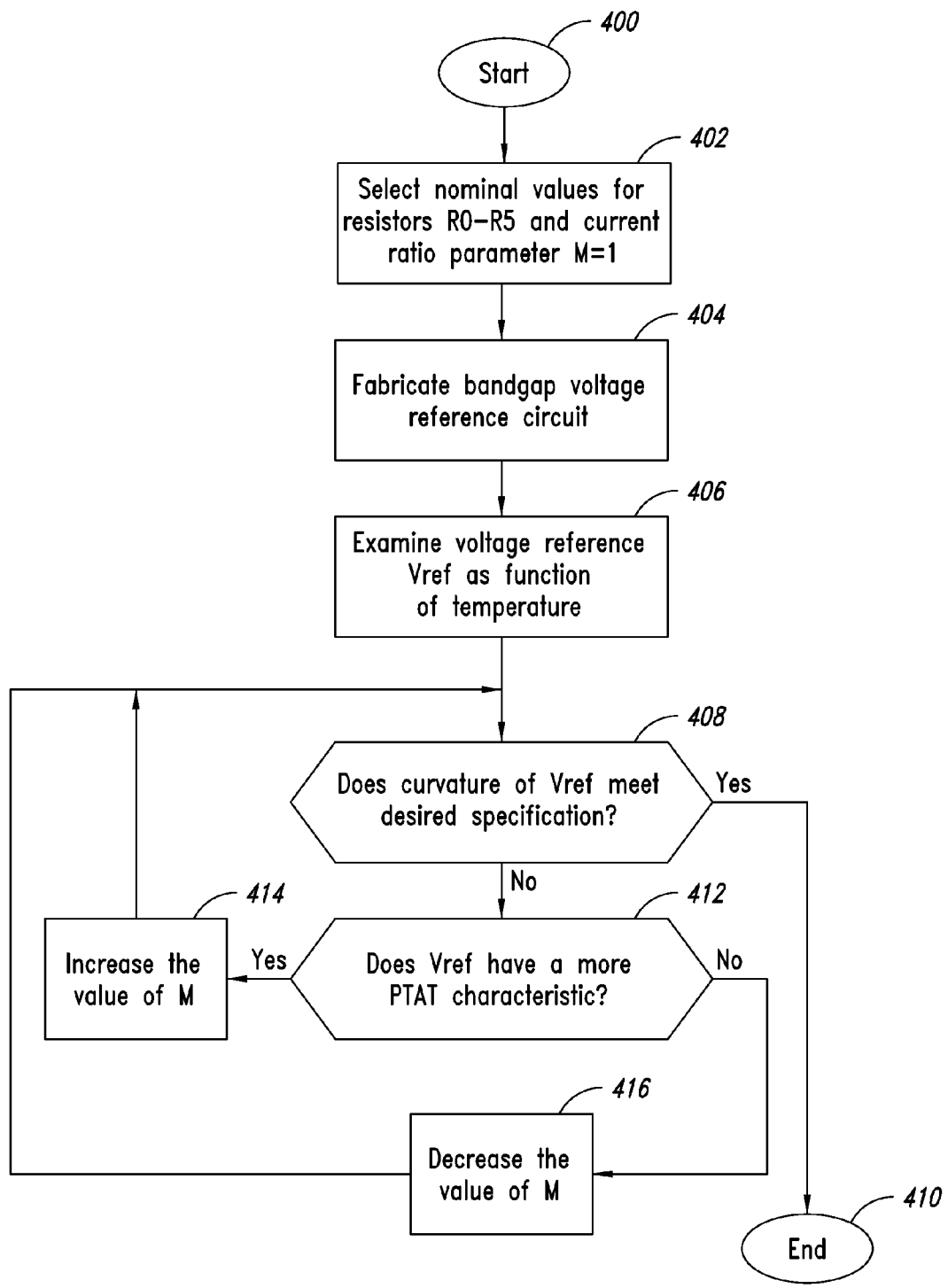
FIG. 4 is a flowchart illustrating a process for tuning the current ratio parameter of the bandgap voltage reference circuit of FIG. 3 according to one embodiment of the present invention.

In operation, the bandgap voltage reference circuit 300 generates the voltage reference Vref having a reduced curvature through the tuning of the current ratio parameter m defining the current supplied by the PMOS transistor MX in the curvature correction circuitry 306, as will now be explained in more detail with reference to the flowchart of FIG. 4. FIG. 4 is a flowchart illustrating a process for tuning the current ratio parameter m of the bandgap voltage reference circuit 300 of FIG. 3 according to one embodiment of the present invention. Referring to FIGS. 3 and 4, the process begins in step 400 and proceeds immediately to step 402 in which values are selected for the resistors R0-R5 with the current ratio parameter m set to 1 for a nominal process that is utilized to form these and the other components of the bandgap voltage reference circuit 300. The process parameters defining the "nominal process" include a variety of different parameters such as time, temperature, sizes of devices, dopant implantation parameters, and so on, as will be appreciated by those skilled in the art.

From step 402 the process goes to step 404 and the bandgap voltage reference circuit 300 is fabricated according to the desired manufacturing process and the nominal values selected for the resistors R0-R5 and the current ratio parameter m equal to 1. The process then goes to step 406 and the characteristics of the actual voltage reference Vref generated by the fabricated bandgap voltage reference circuit 300 are examined as a function of temperature to thereby determine the actual curvature of the generated voltage reference. Once the actual curvature is characterized in step 406, the process proceeds to step 408 and determines whether the curvature of the voltage reference Vref meets the required specifications for the bandgap voltage reference circuit 300. When the determination in step 408 is positive, the bandgap voltage reference circuit 300 and voltage reference Vref generated thereby meet the required specifications and the process accordingly goes to step 410 and terminates.

When the determination in step 408 is negative, the curvature of the voltage reference Vref does not meet desired specifications and the process proceeds to step 412 and determines whether the voltage reference has more of a PTAT characteristic due to variations in the process utilized to fabricate the bandgap voltage reference circuit 300. In step 412 the process effectively determines whether the voltage reference Vref has more of a PTAT characteristic or a CTAT characteristic so that the current ratio parameter m can be adjusted accordingly to achieve the desired curvature of the voltage reference, as will now be explained in more detail.

Before describing the remainder of the process set forth in the flowchart of FIG. 4, general characteristics of the voltage reference Vref developed by the bandgap voltage reference circuit 300 will first be discussed in order to better understand the process. Referring back to FIG. 3, it is seen that the reference current Ik is given by the following equation:

$$\begin{aligned} Ik &= \frac{Vref}{R3} \\ &= Iptat + Ivbe1 + INL \\ &= \frac{\frac{kT}{q}\ln(N)}{R0} + Vbe2\left(\frac{1}{R2} + \frac{1}{R5}\right) - \frac{Vbe3}{R5}. \end{aligned} \tag{8}$$

As will be appreciated by those skilled in the art, increasing the value of the collector/emitter current through a bipolar junction transistor results in the base-emitter voltage Vbe of that transistor having more of a PTAT characteristic as a function of temperature than when the collector/emitter current has a lower value. Accordingly, increasing the value of the current ratio parameter m increases the current m*Ik through the bipolar junction transistor Q3 to thereby cause a more PTAT characteristic for the base-emitter voltage Vbe3 of the transistor Q3. As seen in equation (8), since the base-emitter voltage Vbe3 of the transistor Q3 is subtracted from the overall value of the reference current Ik then net effect is that increasing the value of the current ratio parameter m resulting in a more PTAT characteristic for the base-emitter voltage Vbe3 of transistor Q3 results in reducing the value of the reference current Ik and in this way has a CTAT effect on the value of the reference current. The converse is of course also true, namely that decreasing the value of the current ratio parameter m results in the base-emitter voltage Vbe3 of transistor Q3 having more of a CTAT characteristic and thus the net effect of decreasing the current ratio parameter causes a PTAT effect on the value of the reference current Ik as seen from equation (8).

Returning now to the flowchart of FIG. 4, when the determination in step 412 indicates that the voltage reference Vref has more of a PTAT characteristic than is desired, the process proceeds to step 414 and increases the value of the current ratio parameter m. Increasing the value of the current ratio parameter m has a net CTAT effect on the value of the reference current Ik as just discussed. From step 414 the process goes back to step 408 and once again determines whether the curvature of the voltage reference Vref meets the desired specifications for the bandgap voltage reference circuit 300. The process repeats steps 408, 412, and 414 so long as the determination in step 408 is negative and the determination in step 412 is positive. Once the determination in step 408 is positive, meaning that the curvature of the voltage reference Vref meets the desired specifications, the process goes to step 410 and terminates.

When the determination in step 412 is negative, this means that the voltage reference Vref does not have more of a PTAT characteristic and therefore has more of a CTAT characteristic. When this is true, the process goes from step 412 to step 416 and decreases the value of the current ratio parameter m. Decreasing the value of the current ratio parameter m has a net PTAT effect on the value of the reference current Ik as discussed above. From step 416 the process goes back to step 408 and once again determines whether the curvature of the voltage reference Vref meets the desired specifications for the bandgap voltage reference circuit 300. The process repeats steps 408, 412, and 416 so long as the determination in step 408 is negative and the subsequent determination in step 412 is also negative. Once the determination in step 408 is positive the curvature of the voltage reference Vref meets the desired specifications and the process goes to step 410 and terminates.

As seen from the description of the process of FIG. 4, with the bandgap voltage reference circuit 300 once the nominal values for the resistors R0-R5 and current ratio parameter m (with m=1) have been selected the specific value of the current ratio parameter can be adjusted to thereby minimize the curvature of the voltage reference Vref generated by the circuit. In this way minimum curvature and thus optimized performance of the bandgap voltage reference circuit 300 may be achieved by tuning the single current ratio parameter m. This is in contrast to prior approaches where minimum curvature and thus optimized performance were obtained by tuning multiple components in the bandgap reference voltage circuit such as tuning the resistors R0-R5, as will be discussed in more detail below.

Figure 5:
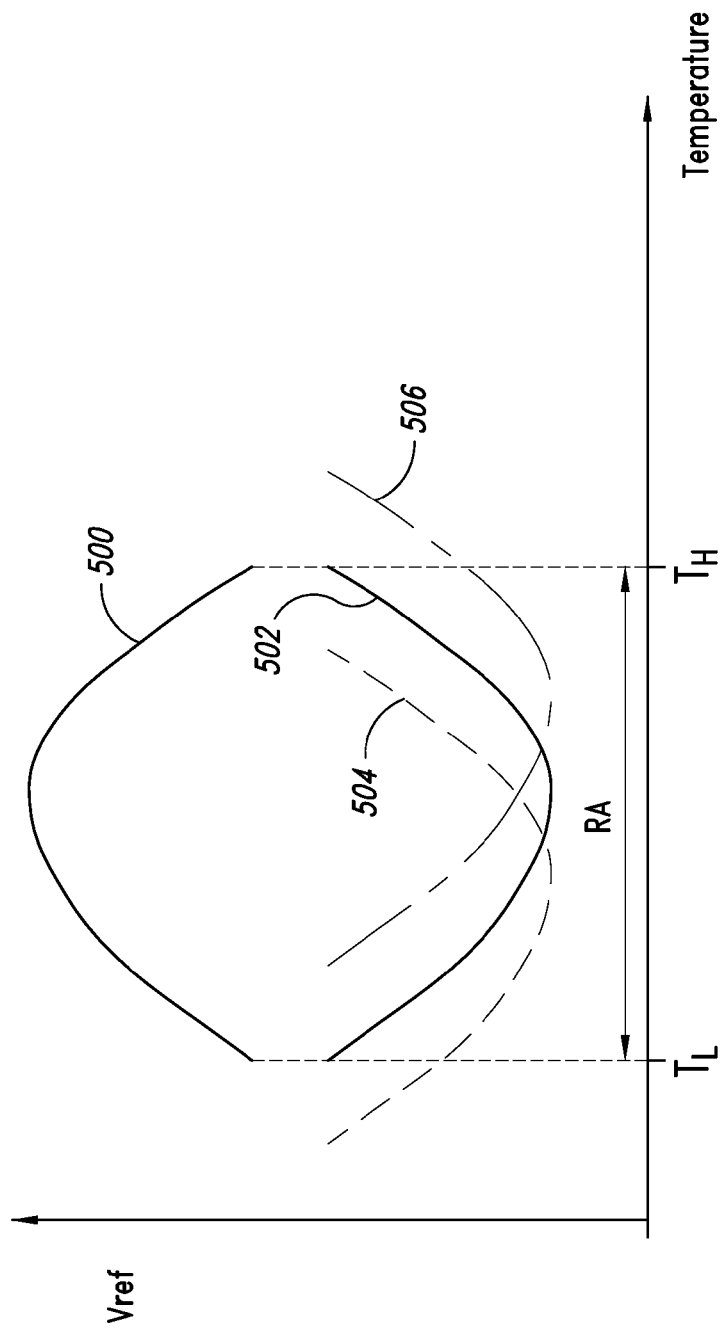
FIG. 5 is a graph showing the effect of changing the value of the current ratio parameter when tuning this parameter to reduce the curvature of the bandgap voltage reference circuit of FIG. 3.

A graphical illustration showing the effect of varying or tuning the value of the current ratio parameter m is now provided with reference to the graph of FIG. 5. The graph shows temperature T along the horizontal axis and the magnitude of the voltage reference Vref along the vertical axis. In the graph a first line 500 depicts a first profile of the voltage reference Vref of the bandgap voltage reference generator 300 without any curvature correction. The first profile given by line 500 is thus the same as the graph of FIG. 2. A second line 502 shows a second profile corresponding to the curvature correction applied to voltage reference Vref via the curvature correction circuitry 306 (FIG. 3). The second profile given by line 502 is ideally the inverse of the first profile given by line 500 to thereby effectively cancel the first profile such that the voltage reference Vref is approximately a constant value over the desired temperature range, which would be a horizontal line (not shown) in the graph of FIG. 5. Thus, the voltage reference Vref generated by the bandgap voltage reference circuit 300 including curvature correction circuitry 306 is given by the sum of the first and second profiles given by lines 500 and 502, respectively, and when these two profiles are properly aligned the resulting voltage reference is approximately constant over the desired temperature range. Each of the first and second profiles extends over a temperature range RA of interest defined by a low temperature TL and a high temperature TH.

Adjusting the value of the current ratio parameter m shifts the second profile corresponding to line 502 either to the left or to the right along the temperature axis. When the current ratio parameter m has the optimum value the second profile is aligned with the first profile, as is shown in FIG. 5 via the line 502. The second profile corresponding to line 502 substantially cancels or compensates for the first profile corresponding to line 500 such that the voltage reference Vref has a minimum curvature. Now if the current ratio parameter m initially has a value that is smaller than the optimum value then the second profile would be shifted to the left as shown by the line 504 in FIG. 5. Thus, within the temperature range RA of interest, the second profile when given by line 504 would not substantially cancel or compensate for the first profile given by line 500. In this situation, the value of the current ratio parameter m would then need to be increased through the process of FIG. 4 to thereby effectively shift the second profile from the position given by line 504 to the right until the second profile is in the optimum position given by line 502. Similarly, if the current ratio parameter m initially has a value that is larger than the optimum value then the second profile would be shifted to the right as shown by the line 506 in FIG. 5. Once again, within the temperature range RA of interest the second profile when given by line 506 would not substantially cancel or compensate for the first profile given by line 500. In this situation, the value of the current ratio parameter m would then need to be reduced through the process of FIG. 4 to thereby effectively shift the second profile from the position shown by line 506 to the left until the second profile is in the optimum position given by line 502.

Figure 6:
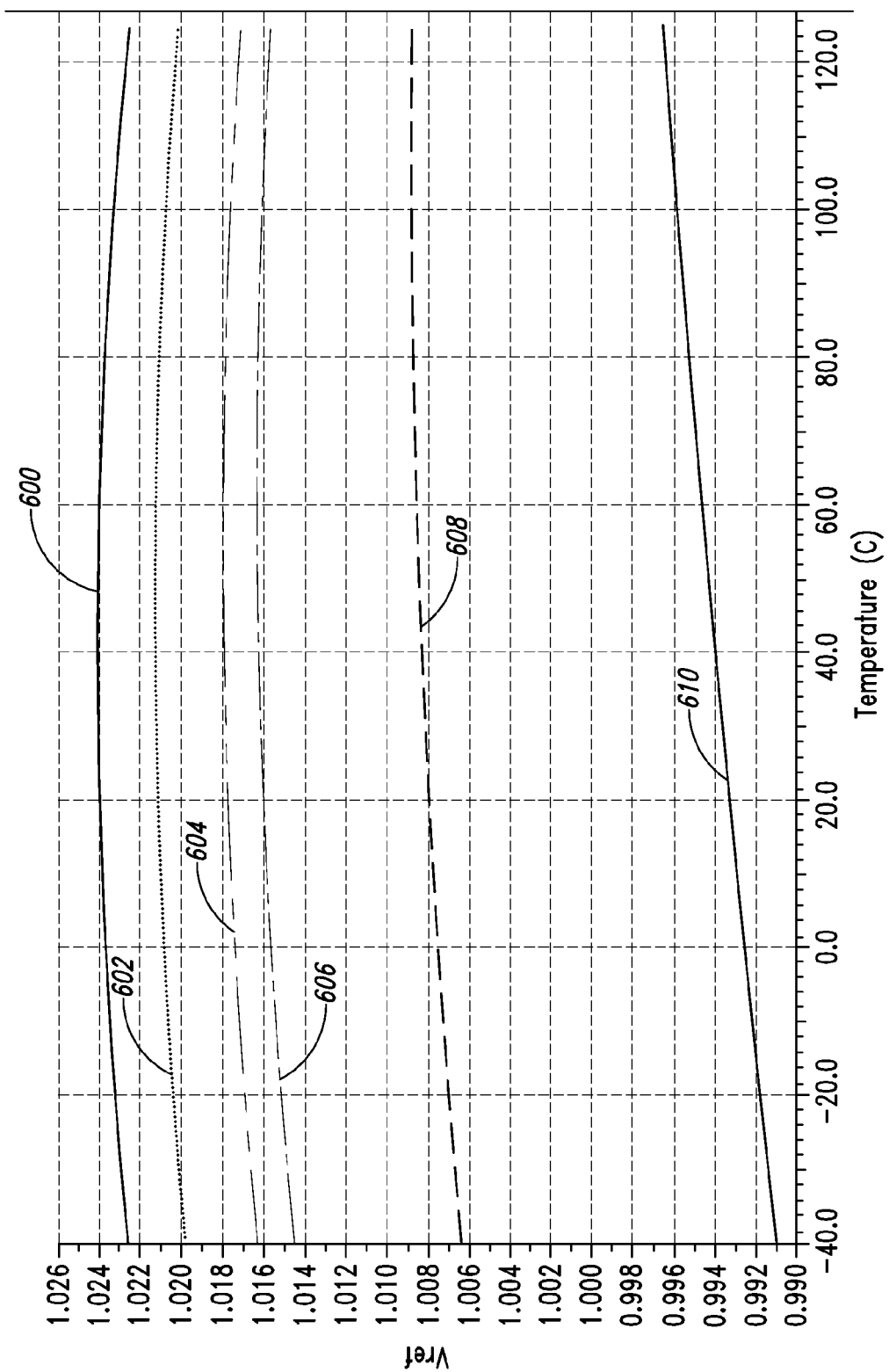
FIG. 6 is a graph showing the effect that different resistor values in the curvature correction circuit of FIG. 3 have on the curvature of the bandgap voltage reference circuit of FIG. 3.

FIG. 6 is a graph showing the effect that the values of resistors R4 and R5 in the curvature correction circuitry 306 of FIG. 3 have on the curvature of the bandgap voltage reference circuit 300 (FIG. 3). Recall, these resistors R4 and R5 have the same value and thus will be referred to collectively as a single component in the remainder of the discussion of FIG. 6. The graph of FIG. 6 shows that as the value of resistor R4, R5, decreases the profile of the voltage reference Vref as a function of temperature assumes an increasingly PTAT characteristic. More specifically, the top line 600 in the graph of FIG. 6 shows the profile of the voltage reference Vref when the resistor R4, R5 has a value of 5 MΩ. This relatively large value for the resistor R4, R5 essentially removes the curvature correction circuitry 306 such that the bandgap voltage reference circuit 300 essentially has no curvature correction and thus operates approximately the same as the bandgap voltage reference circuit 100 of FIG. 1. The profile of the top line 600 accordingly is essentially the same as the graph of FIG. 2 as well as the first profile (line 500) previously discussed with reference to FIG. 5.

The lines 602-610 in FIG. 6 corresponds to the values for the resistor R4, R5 of 1 MΩ, 500 KΩ, 400 KΩ, 200 KΩ, and 100 KΩ, respectively. As just mentioned, when the value of the resistor R4, R5 is very large as for line 600 and the curvature correction circuitry 306 is effectively removed from the circuit and the profile of the voltage reference Vref is essentially the same as for the circuit 100 of FIG. 1. The scale for the voltage reference Vref along the vertical axis in FIG. 6 is different than the prior figures which is why inverse-parabolic line 600 appears "flatter" than in FIG. 2. As the value of the resistor R4, R5 decreases the profile of the voltage reference Vref assumes a more PTAT characteristic, as is clearly seen for the line 610 corresponding to the smallest value for the resistor R4, R5.

As FIG. 6 illustrates changing the value of the resistor R4, R5 changes the profile of the voltage reference Vref, with the profile assuming an increasingly PTAT characteristic as the value of the resistor R4, R5 is decreased. Note that the example of FIG. 6 corresponds to a nominal-case simulation of the bandgap voltage reference circuit 300 for the value of the current ratio parameter m=1, which is not the case for most embodiments of the present invention. This was done to illustrate conceptually how tuning of the current ratio parameter m as previously described with reference to FIGS. 3 and 4 adjusts the profile of the voltage reference Vref to optimize the curvature of the bandgap voltage reference circuit 300. In the bandgap voltage reference circuit 300 and other embodiments of the present invention the current ratio parameter m is either greater than one or less than one, although the process of FIG. 6 may result in the current ratio parameter m being equal to 1 in some embodiments of the present invention. Whether the current ratio parameter m is greater or less than one is determined by the characteristics of the profile of the voltage reference Vref. Where the profile of the voltage reference Vref has a PTAT characteristic when the current ratio parameter m=1, as with line 610 in FIG. 6, then the process of FIG. 4 will increase the value of the current ratio parameter m to thereby provide the desired CTAT effect and reduce the curvature of the voltage reference Vref. Conversely, if the profile of the voltage reference Vref has a CTAT characteristic when the current ratio parameter m=1 then the process of FIG. 4 will decrease the value of the current ratio parameter m to thereby provide the desired PTAT effect and reduce the curvature of the voltage reference Vref. Whether the profile of the voltage reference Vref has more of a PTAT or CTAT characteristic as a function of temperature will depend upon the specific values selected for the resistors in the bandgap voltage reference circuit 300 and by process parameters associated with fabrication of the circuit. As such values and process parameters vary the value of the current ratio parameter m may then be adjusted to be either greater than or less than one to thereby optimize the curvature of the bandgap voltage reference circuit 300.

As seen from the above description with the bandgap voltage reference circuit 300 the current ratio parameter m is adjusted through the process of FIG. 4 to a value of either less than or greater than one to optimize the curvature of the voltage reference Vref. Thus, by adjusting this single parameter, namely the current ratio parameter m, desired performance of the bandgap voltage reference circuit 300 is realized. This is contrary to conventional circuits that provide curvature correction circuitry and then adjust the values of the resistors contained in this curvature correction circuitry and the bandgap voltage reference circuitry to reduce curvature as much as possible. With these prior approaches multiple component values, namely resistor values, must typically be changed to optimize performance of the bandgap voltage reference. As a result, resistor networks and programming switches must be formed so that these switches and resistor networks can then be utilized to adjust the values of the various resistors and achieve the desired performance. This is not efficient in terms of either utilization of silicon area in the semiconductor device in which the bandgap voltage reference circuit is formed or in terms of accuracy due to the effects the switches can have on circuit performance. Embodiments of the present invention eliminate the need for such tuning of multiple resistors in the bandgap voltage reference circuit and instead enable curvature to be minimized by adjusting a single parameter of the bandgap voltage reference circuit, namely the current ratio parameter m.

As the current ratio parameter m, or R4 and R5, are programmed differently from their nominal values, not just the voltage reference Vref output curvature is changed, but the vref output level is also changed. However, after curvature adjustment with the current ratio parameter m, one can easily program resistor R3 appropriately to re-center the voltage reference Vref level to a desired value. Note that, changing the value of resistor R3 value will not alter the curvature shape of voltage reference Vref. The current lk having a PTAT component and a CTAT component still flows through the resistor R3 and, as discussed above with regard to FIGS. 1 and 3, the current lk times the value of the resistor R3 corresponds to the voltage reference Vref. Thus, the value of resistor R3 does not affect the curvature of the voltage reference Vref but does affect the absolute value of the voltage reference.

Figure 7:
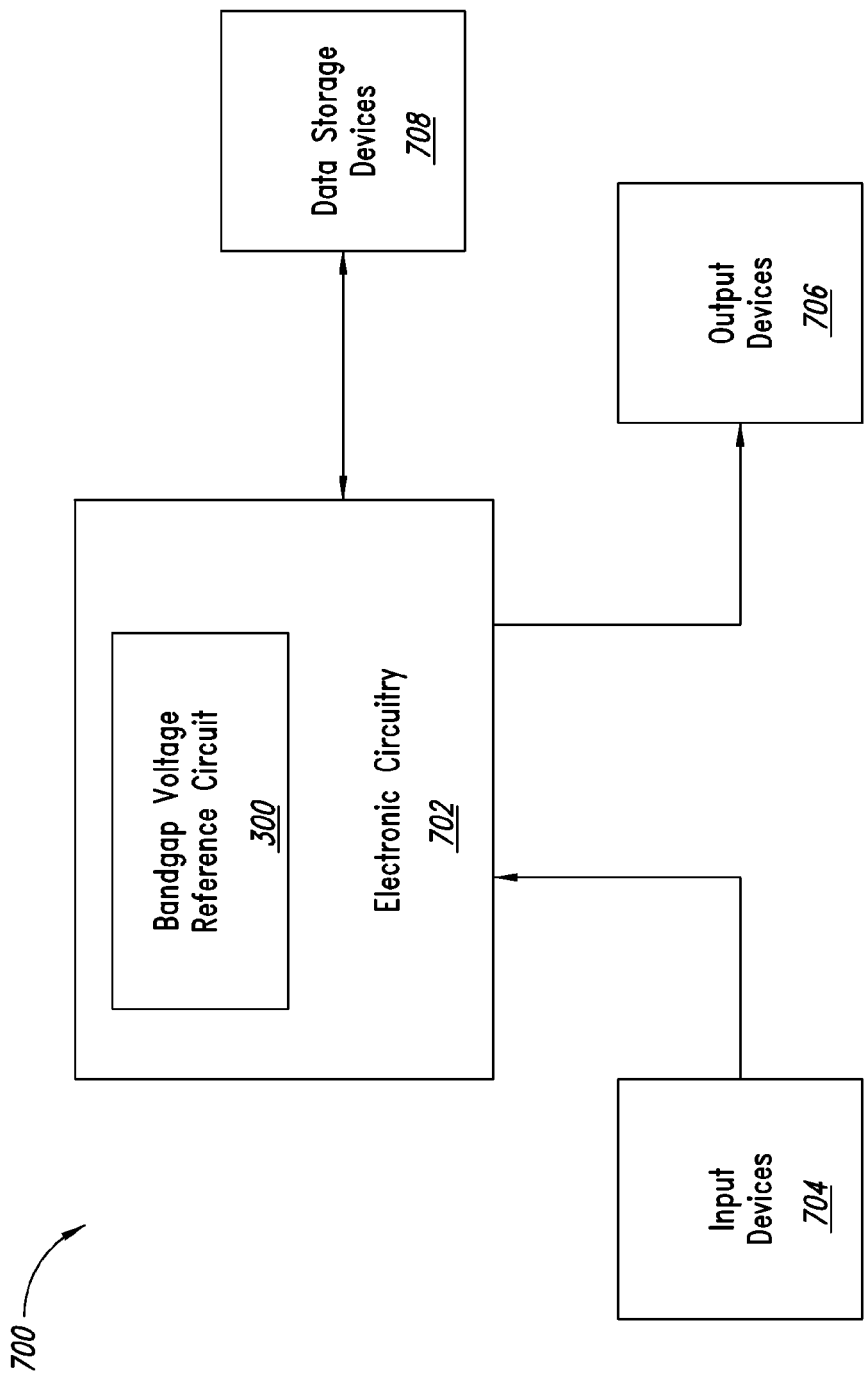
FIG. 7 is a functional block diagram of an electronic system including the bandgap voltage reference circuit of FIG. 3 according to another embodiment of the present invention.

FIG. 7 is a functional block diagram of an electronic system 700 including the bandgap voltage reference circuit 300 of FIG. 3 according to another embodiment of the present invention. The electronic system 700 includes electronic circuitry 702 that contains the bandgap voltage reference circuit 300. The electronic circuitry can be any of a variety of different types of circuitry to perform the desired function of the system 700, such as computer circuitry, measurement and control system circuitry, and so on, and may be contained within various components within such systems such as in power supply components and data conversion circuits such as analog-to-digital converters and digital-to-analog converters. The electronic circuitry 702 includes circuitry for performing the required functions of the system 700 and may include analog and digital circuitry and specific software to perform specific calculations or tasks. In addition, the electronic system 700 includes one or more input devices 704, such as a keyboard or a mouse, coupled to the electronic circuitry 702 to allow an operator to interface with the electronic system. The electronic system 700 can also include one or more output devices 706 coupled to the electronic circuitry 702, with such output devices being, for example, printers and video displays. One or more data storage devices 708 may also be coupled to the electronic circuitry 702 to store data or retrieve data from external storage media (not shown). Examples of typical storage devices 708 include hard and floppy disks, tape cassettes, compact disk read-only (CD-ROMs) and compact disk read-write (CD-RW) memories, and digital video disks (DVDs), FLASH memory devices, and so on.

One skilled in the art will understand that even though various embodiments and advantages of the present invention have been set forth in the foregoing description, the above disclosure is illustrative only, and changes may be made in detail, and yet remain within the broad principles of the invention. Moreover, the functions performed by various components described above may be implemented through circuitry or components other than those disclosed for the various embodiments described above. Moreover, the described functions of the various components may be combined to be performed by fewer elements or performed by more elements, depending upon design considerations for the device or system being implemented, as will appreciated by those skilled in the art. Therefore, the present invention is to be limited only by the appended claims.

What is claimed is:

1. A bandgap voltage reference circuit, comprising:
   a current generation stage configured to generate a proportional to absolute temperature (PTAT) current and a complementary to absolute temperature (CTAT) current and to generate a reference current by combining the PTAT and CTAT currents, the current generation stage including a plurality of components having corresponding component parameters that affect a curvature of a bandgap voltage reference;
   an output stage coupled to the current generation stage and configured to combine the PTAT current and the CTAT current to generate the bandgap voltage reference; and
   a curvature correction circuit configured to generate a curvature correction current that mirrors the reference current generated from the PTAT and CTAT currents, the curvature correction current having a ratio relative to the reference current given by a variable current ratio parameter, the variable current ratio parameter being adjusted to a value that provides a desired curvature of the bandgap voltage reference without adjusting the values of any of the component parameters in the current generation stage.

2. The bandgap voltage reference circuit of claim 1 wherein the current generation stage comprises first and second bipolar junctions transistors, with a base-emitter voltage across the first bipolar junction transistor being used in generating the CTAT current and a difference between the base-emitter voltages of the first and second bipolar junction transistors being used to generate the PTAT current.

3. The bandgap voltage reference circuit of claim 2 wherein the current generation stage comprises:
   a first MOS transistor and first diode-connected bipolar junction transistor coupled in series between a supply voltage node and a reference voltage node;
   a second MOS transistor, a first resistor, and a second diode-connected bipolar junction transistor coupled respectively in series between the supply voltage node and the reference voltage node with a node being defined at the interconnection of the first resistor and first MOS transistor; and
   an operational amplifier having a first input coupled to receive the base- emitter voltage of the first bipolar junction transistor and having a second resistor coupled between the first input and the voltage reference node, and the operational amplifier having a second input coupled to the node defined at the interconnection of the first resistor and first MOS transistor, and having a third resistor coupled between the second input and the voltage reference node.

4. The bandgap voltage reference circuit of claim 3 wherein the output stage comprises:
   a third MOS transistor and fourth resistor coupled in series between the supply voltage node and the reference voltage node and operable to generate the voltage reference across the fourth resistor.

5. The bandgap voltage reference circuit of claim 4 wherein the curvature correction circuit comprises:
   a fourth MOS transistor and third diode-connected bipolar junction transistor coupled in series between the supply voltage node and the reference voltage node, with an interconnection node being defined at the interconnection of the emitter of the third diode-coupled bipolar junction transistor and the fourth MOS transistor, and wherein the fourth MOS transistor supplies a current through the third diode-connected bipolar junction transistor that is equal to the current ratio parameter times the currents supplied by the first and second MOS transistors;
   a fifth resistor connected between the emitter of the first bipolar junction transistor and the interconnection node; and
   a sixth resistor connected between the second input of the operational amplifier and the interconnection node.

6. The bandgap voltage reference circuit of claim 5 wherein each of the MOS transistors is a PMOS transistor.

7. The bandgap voltage reference circuit of claim 6 wherein each of the bipolar junction transistors is a PNP transistor.

8. An electronic system, comprising:
   electronic circuitry including a bandgap voltage reference circuit, the bandgap voltage reference circuit comprising:
      a current generation stage configured to generate a proportional to absolute temperature (PTAT) current and a complementary to absolute temperature (CTAT) current and to generate a reference current by combining the PTAT and CTAT currents, the current generation stage including a plurality of components having corresponding component parameters that affect a curvature of a bandgap voltage reference;
      an output stage coupled to the current generation stage and configured to combine the PTAT current and the CTAT current to generate a bandgap voltage reference; and
      a curvature correction circuit configured to generate a curvature correction current that mirrors the reference current generated from the PTAT and CTAT currents to generate a mirrored current having a ratio relative to the reference current given by a current ratio parameter, the current ratio parameter being a tunable parameter that is set to a value, without adjusting the values of any of the component parameters in the current generation stage, to minimize the curvature of the bandgap voltage reference;
   at least one input device coupled to the electronic circuitry;
   at least one output device coupled to the electronic circuitry; and
   at least one storage device coupled to the electronic circuitry.

9. The electronic system of claim 8 wherein the electronic circuitry comprises a data conversion circuit.

10. The electronic system of claim 9 wherein the data conversion circuit comprises one of an analog-to-digital converter and a digital-to-analog converter.

11. The electronic system of claim 8 wherein the current generation stage comprises first and second bipolar junctions transistors, with a base-emitter voltage across the first bipolar junction being used in generating the CTAT current and a difference between the base-emitter voltage of the first and second bipolar junction transistors being used to generate the PTAT current.

12. The electronic system of claim 11 wherein the current generation circuit comprises:
   a first MOS transistor and first diode-connected bipolar junction transistor coupled in series between a supply voltage node and a reference voltage node;
   a second MOS transistor, a first resistor, and a second diode-connected bipolar junction transistor coupled respectively in series between the supply voltage node and the reference voltage node with a node being defined at the interconnection of the first resistor and first MOS transistor; and an operational amplifier having a first input coupled to receive the base-emitter voltage of the first bipolar junction transistor and having a second resistor coupled between the first input and the voltage reference node, and the operational amplifier having a second input coupled to the node defined at the interconnection of the first resistor and first MOS transistor, and having a third resistor coupled between the second input and the voltage reference node.

13. The electronic system of claim 12 wherein the output stage comprises:
a third MOS transistor and fourth resistor coupled in series between the supply voltage node and the reference voltage node and operable to generate the voltage reference across the fourth resistor.

14. The electronic system of claim 13 wherein the curvature correction circuit comprises:
a fourth MOS transistor and third diode-connected bipolar junction transistor coupled in series between the supply voltage node and the reference voltage node, with an interconnection node being defined at the interconnection of the emitter of the third diode-coupled bipolar junction transistor and the fourth MOS transistor, and wherein the fourth MOS transistor supplies a current through the third diode-coupled bipolar junction transistor that is equal to the current ratio parameter times the currents supplied by the first and second MOS transistors;
a fifth resistor connected between the emitter of the first bipolar junction transistor and the interconnection node; and
a sixth resistor connected between the second input of the operational amplifier and the interconnection node.

15. The electronic system of claim 8 wherein each of the MOS transistors is a PMOS transistor.

16. The electronic system of claim 8 wherein each of the bipolar junction transistors is PNP transistor.

17. A method for generating a curvature- compensated bandgap voltage reference, comprising:
generating a proportional to absolute temperature (PTAT) current and a complementary to absolute temperature (CTAT) current;
generating a first reference current that is equal to the sum of the PTAT and CTAT currents;
generating a second reference current that is equal to the product of a current ratio parameter times the first reference current, where the current ratio parameter is greater than one, equal to one, or less than one;
supplying the second reference current through a reference diode- connected bipolar junction transistor;
adjusting the value of the first reference current as a function of the value of the base-emitter voltage across the reference diode-connected bipolar junction transistor;
generating the bandgap voltage reference responsive to the reference current; and
adjusting only the value of the current ratio parameter to thereby vary the value of the second reference current to minimize curvature in the bandgap voltage reference over a temperature range.

18. The method of claim 17 wherein adjusting the value of the reference current as a function of the value of the base-emitter voltage across the reference diode-connected bipolar junction transistor comprises generating a non-linear current having a value that is a function of the value of the base-emitter voltage of the reference bipolar junction transistor.

19. The method of claim 18 wherein the non-linear current is generated responsive to a non-linear voltage corresponding to the difference between the base-emitter voltage of the reference bipolar junction transistor having a temperature-independent current supplied thereto and the base-emitter voltage of a second bipolar junction transistor having a PTAT current supplied thereto.

20. The method of claim 17 wherein generating the PTAT current comprises generating a current that is proportional to the voltage difference between the base-emitter voltages of two diode-connected bipolar junction transistors having different current densities as a result of the reference current being supplied to each of these two diode-connected transistors.

21. The method of claim 17 wherein generating the CTAT current comprises generating a current that is proportional to the base-emitter voltage of a diode-connected bipolar junction transistor.

22. A method of manufacturing a curvature-compensated bandgap voltage reference circuit, comprising:
fabricating the bandgap voltage reference circuit having nominal values for various parameters in the bandgap voltage reference circuit, and the bandgap voltage reference circuit having curvature correction circuitry that generates a mirrored current that is equal to the value of a current ratio parameter times a reference current;
determining the value of a bandgap voltage reference as a function of temperature for the bandgap voltage reference circuit;
determining whether the bandgap voltage reference as a function of temperature satisfies a curvature test criteria; and
when the bandgap voltage reference as a function of temperature does not satisfy the curvature test criteria, adjusting the value of the current ratio parameter until the curvature test criteria are satisfied while not adjusting any of the nominal values for the various parameters in the bandgap voltage reference circuit.

23. The method of claim 22 wherein the operation of determining whether the bandgap voltage reference as a function of temperature satisfies the test criteria comprises:
determining whether the bandgap voltage reference has a more PTAT characteristic;
when the bandgap voltage reference has a more PTAT characteristic, increasing the value of the current ratio parameter until the bandgap voltage reference as a function of temperature satisfies the test criteria; and
when the bandgap voltage reference does not have a more PTAT characteristic, decreasing the value of the current ratio parameter until the bandgap voltage reference as a function of temperature satisfies the test criteria.

* * * * *